(12) United States Patent
Lin et al.

(10) Patent No.: US 6,777,708 B1
(45) Date of Patent: Aug. 17, 2004

(54) APPARATUS AND METHODS FOR DETERMINING FLOATING BODY EFFECTS IN SOI DEVICES

(75) Inventors: Hung-Jen Lin, Sunnyvale, CA (US); W. Eugene Hill, Moss Beach, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 63 days.

(21) Appl. No.: 10/342,541

(22) Filed: Jan. 15, 2003

(51) Int. Cl.[7] .......................... H01L 23/58; H01L 21/66
(52) U.S. Cl. .................. 257/48; 438/18; 700/121
(58) Field of Search ................... 257/48, 347; 700/121; 324/765, 537; 438/314, 317, 17, 18

(56) References Cited

U.S. PATENT DOCUMENTS

| | | | |
|---|---|---|---|
| 4,719,608 A | 1/1988 | Genat et al. | |
| 5,457,400 A | 10/1995 | Ahmad et al. | |
| 5,619,463 A | 4/1997 | Malhi | |
| 5,952,891 A | 9/1999 | Boudry | |
| 5,995,011 A | 11/1999 | Kurihara et al. | |
| 6,078,058 A | 6/2000 | Hsu et al. | |
| 6,239,591 B1 * | 5/2001 | Bryant et al. | 324/158.1 |
| 6,392,855 B1 | 5/2002 | Kuang et al. | |
| 6,466,082 B1 * | 10/2002 | Krishnan | 327/543 |
| 6,498,370 B1 * | 12/2002 | Kim et al. | 257/347 |
| 6,535,015 B1 * | 3/2003 | Krishnan et al. | 324/769 |

* cited by examiner

Primary Examiner—Craig A. Thompson
(74) Attorney, Agent, or Firm—Eschweiler & Associates, LLC

(57) ABSTRACT

Methods and systems are described for determining floating body delay effects in an SOI wafer, wherein test apparatus is provided in a wafer comprising a plurality of floating body devices fabricated in series in the wafer, and a pulse generation circuit providing a pulse output corresponding to a delay time associated with the floating body chain according to an input pulse edge and a propagated pulse edge from the floating body devices.

29 Claims, 11 Drawing Sheets

APPARATUS AND METHODS FOR DETERMINING FLOATING BODY EFFECTS IN SOI DEVICES

FIELD OF INVENTION

The present invention relates generally to semiconductor device processing and more particularly to apparatus and methods for determining floating body effects such as hysteretic propagation delays in SOI devices.

BACKGROUND OF THE INVENTION

A continuing trend in the semiconductor manufacturing industry is toward smaller and faster transistor devices, which consume less power. Toward that end, device scaling is a continuous design goal, wherein device features sizes and spaces are reduced. However, performance limits are reached in technologies where scaled transistors and other electrical devices are formed directly in a wafer substrate, such as silicon. These are sometimes referred to as bulk devices. To surpass the performance limitations of bulk devices, recent scaling efforts have included the use of silicon over oxide (SOI) wafers, in which a silicon layer overlies an insulator layer above a silicon substrate. SOI wafers may be fabricated according to known SOI wafer manufacturing techniques, such as SIMOX, bond-and-etch-back and smart-cut technology.

In SOI wafers, the active semiconductor regions of the wafer are formed in the silicon on top of the oxide insulator, whereby these active regions are electrically isolated from one another. This technique achieves certain design advantages, such as a significant reduction in parasitic capacitances that exist in non-SOI (bulk) devices, as well as enhanced resistance to radiation damage. Partially depleted SOI devices are produced using one type of SOI process in which the transistors are formed in a deposited semiconductor layer which is thick enough that the channel region will not be fully depleted through its full thickness when the device is in operation. The transistor design and operation in partially depleted SOI processes are similar to that of bulk CMOS devices.

Although SOI designs provide certain advantages over bulk designs, SOI devices suffer from certain effects related to the isolation of the active devices from the substrate material underlying the oxide layer, which are sometimes referred to as floating-substrate or floating body effects. In bulk transistors, the transistor body may be electrically connected through the substrate. In this case, the transistor body is at a relatively fixed potential, and consequently, the transistor threshold voltage is stable relative to the drain-to-source voltage. In many SOI transistors however, the body (e.g., the undepleted silicon under the gate) is electrically floating with respect to the substrate because of the intervening oxide insulator layer. Thus, when sufficient drain-to-body bias is applied to the transistor, impact ionization can generate electron-hole pairs near the drain. These electron-hole pairs cause a voltage differential to build up between the body node and the source of the transistor because majority carriers travel to the body while the minority carriers travel to the drain. The resulting voltage differential lowers the effective threshold voltage, thereby increasing the drain current.

The isolated body creates capacitive coupling between the body and the gate, between the body and the source, and between the body and the drain, in addition to diode couplings between the body and the source and between the body and the drain. These effects bias the body, creating a variation in the transistor threshold voltage during switching which is dependent upon the current and past states of the transistor. During switching, these effects bias the body through two mechanisms; capacitive coupling between the body and the gate, source, and drain, as well as charging and discharging between the body and the source and drain through diode coupling. This history dependent operation, sometimes referred to as hysteretic behavior, results from potentially large uncertainties in the floating body potential and, thus, uncertainties in the threshold voltage of devices due to unknown switching history.

These floating body effects can contribute to undesirable performance shifts in the transistor relative to design, as well as to increased instability of the transistor operating characteristics. In order to address these SOI floating body issues, some designs provide for electrical connection of the body or the source of an SOI transistor to the substrate. Transistors formed in this manner in an SOI wafer are sometimes referred to as tied body transistors. Although this technique serves to prevent body charging by creating a direct contact to the substrate, implementation of this approach complicates the device manufacturing process and also increases area overhead because tied body devices consume a larger area than floating body devices. Thus, most SOI designs must take these floating body effects into account.

Because these and other floating body issues affect end-product device performance, monitoring the hysteretic behavior of SOI devices is needed to refine and monitor the SOI manufacturing process. Thus, it is desirable to measure floating body effects in wafers at various points in a manufacturing process flow. One measure of the veracity of an SOI process is the propagation delays in switching a floating body transistor from one state to another. The threshold voltage of such floating body devices is dependent upon the body potential. The body potential, in turn, is dependent upon the current and past states of the transistor (e.g., the voltages at the various terminals of the device). Thus, the propagation delays are often measured at various voltages with switching signals of varying amounts of preconditioning, to obtain a curve of average propagation delay vs. time.

Typically, these measurements are obtained manually on a test bench, using oscilloscopes and high frequency probes to monitor floating body transistor switching delays under various conditions. Pulse generators are connected to the inputs of inverters or other floating body devices, which are formed of floating body MOS transistors, and the device outputs are monitored using the oscilloscope. Such testing is time consuming, and ill fitted for testing every wafer in a high throughput production setting. Thus, there is a need for improved apparatus and methods for measuring hysteretic propagation delay in SOI devices, which are amenable to automation using readily available, inexpensive test equipment.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, the primary purpose of this summary is to present some concepts of the invention in a simplified form as a prelude to the more detailed description that is presented later. The invention relates to apparatus and methodologies which may be employed to determine hysteretic propagation delay and other floating body effects in SOI devices.

In accordance with one aspect of the invention, test apparatus is provided, which comprises a plurality of floating body devices fabricated in series with one another in the wafer, and having an input for receiving an input pulse edge and an output for providing a propagated pulse edge associated with propagation of the input pulse edge through the chain of floating body devices. The apparatus further comprises a pulse generation circuit, which receives the input pulse edge and the propagated pulse edge, and provides a pulse output corresponding to a delay time associated with the floating body chain according to the input pulse edge and the propagated pulse edge. The width of the pulse output may be representative of the propagation delay of the floating body chain, such as provided by an exclusive-OR gate receiving the input pulse edge and the propagated pulse edge as inputs. The apparatus may further comprise an integrator receiving and integrating the pulse output to provide an integral output having an amplitude corresponding to the floating body chain delay.

Another aspect of the invention provides test systems for determining floating body effects in an SOI wafer, comprising a plurality of floating body devices fabricated in series with one another in the wafer, and a pulse generation circuit, which receives the input pulse edge and the propagated pulse edge, and provides a pulse output corresponding to a delay time associated with the floating body chain. The system further includes a tester comprising means for providing the input pulse edge to the input of the floating body chain, such as a pulse generator, means for sensing the pulse output from the pulse generation circuit, such as a volt meter, and means for determining at least one floating body delay according to the pulse output, such as a processor.

In accordance with still another aspect of the invention, test methods are provided, comprising providing a pulse edge to a floating body chain comprising a plurality of series connected floating body devices in the SOI wafer, providing a pulse output corresponding to a delay time associated with the floating body chain according to the input pulse edge and a propagated pulse edge, and determining a floating body delay value according to the pulse output. The determination of the floating body delay value may comprise integrating the pulse output to provide an integral value, and determining the floating body delay value according to the integral value.

To the accomplishment of the foregoing and related ends, the following description and annexed drawings set forth in detail certain illustrative aspects and implementations of the invention. These are indicative of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1A:
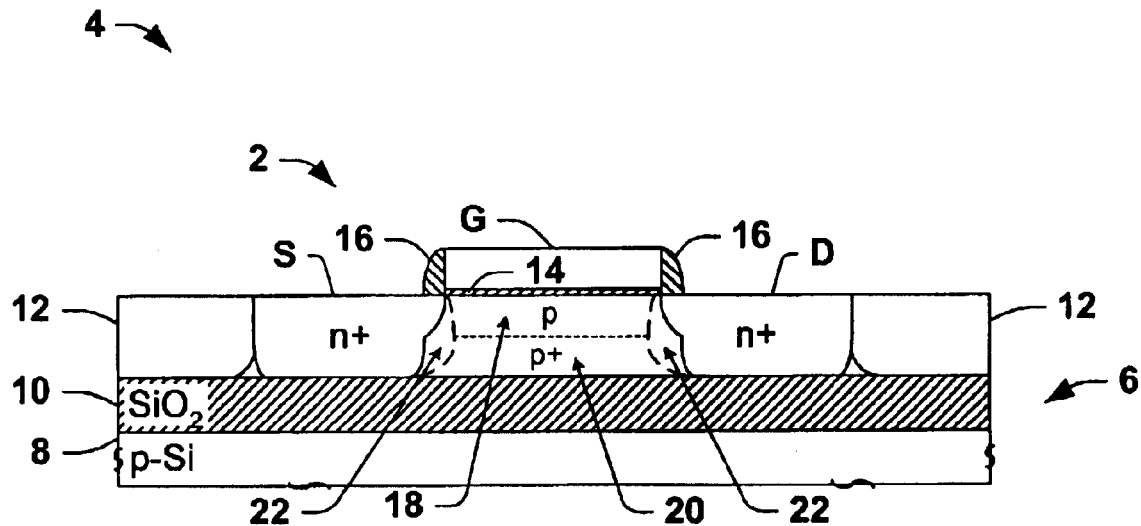
FIG. 1A is a partial side elevation view in section illustrating an exemplary floating body NMOS transistor fabricated in an SOI wafer.

One or more implementations of the present invention will now be described with reference to the drawings, wherein like reference numerals are used to refer to like elements throughout, and wherein the various structures are not necessarily drawn to scale. The present invention provides methods and apparatus for determining or characterizing floating body effects in SOI wafers, which may be implemented in automated test systems and/or in bench testing setups to provide propagation delay information in a timely fashion. Various aspects of the invention are hereinafter illustrated and described in the context of partially depleted SOI devices and processes. However, it will be appreciated that the invention is not limited to use in association with such devices, and that alternative implementations are possible within the scope of the invention, wherein floating body effects may be determined in non-partially depleted SOI devices.

Referring initially to FIGS. 1A–1D, an exemplary floating body NMOS transistor 2 is illustrated as part of a floating body inverter device 4 fabricated in an SOI wafer 6, wherein it is noted that the structures illustrated herein are not necessarily drawn to scale. A cross section of the transistor 2 is illustrated in FIG. 1A. The SOI wafer 6 in this example includes a p doped silicon substrate 8, over which is formed an insulating layer of $SiO_2$ 10. Silicon overlies the oxide layer 10, in which isolation structures 12 are formed. A polysilicon gate G is formed over a thin gate dielectric 14, having spacers 16 formed along the sidewalls thereof. A source region S and a drain region D are implanted and diffused with n+ dopants in one or more implantation steps, and an upper portion of p doped silicon 18 overlies a p+ doped body region 20 of the silicon under the gate G. Optional halo implant regions 22 are provided with p+type dopants to reduce hot-carrier effects in the transistor 2.

Figure 1B:
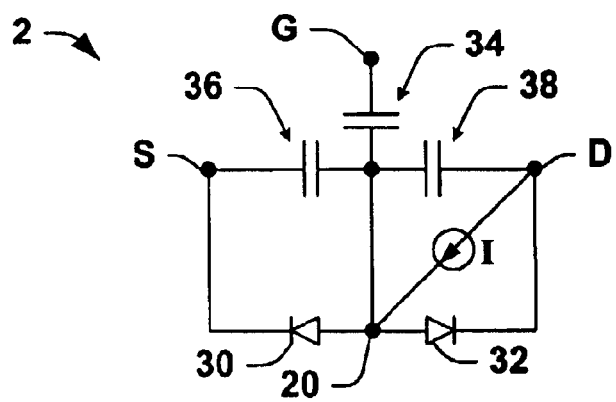
FIG. 1B is a schematic diagram illustrating a circuit representation of various floating body electrical characteristics of the NMOS transistor of FIG. 1A.

As discussed above, the floating body operation of the transistor 2 causes switching history dependent charging of the body region 20, and thus, hysteretic threshold voltage changes, depending upon the current and past states of the transistor 2. This is because the body region 20 is electrically isolated from the substrate 8 by the intervening oxide layer 10. FIG. 1B illustrates a schematic representation of the transistor 2, wherein the body region 20 is diode coupled to the source S and the drain D through diodes 30 and 32, respectively. In addition, the body region 20 is capacitively coupled to the gate G, the source S, and the drain D via capacitances 34, 36, and 38, respectively. A current source I in FIG. 1B represents generated holes injected into the body 20 from the drain D. Without a body contact (e.g., to tie the body 20 to the substrate 8 in FIG. 1A), the floating body 20 is allowed to electrically attain a voltage potential through various charging/discharging mechanisms, such as impact ionization current, drain-induced barrier lowering (DIBL), junction active and/or leakage currents, etc., as well as through capacitive coupling from the gate G, the source S, and the drain D during switching.

Figure 1C:
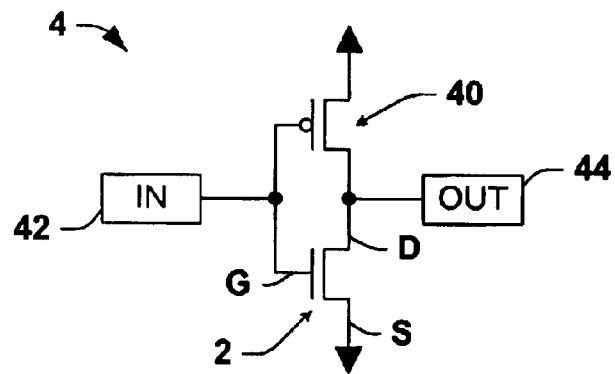
FIG. 1C is a schematic diagram illustrating an inverter device formed using the floating body NMOS device of FIGS. 1A and 1B and a floating body PMOS transistor.
Figure 1D:
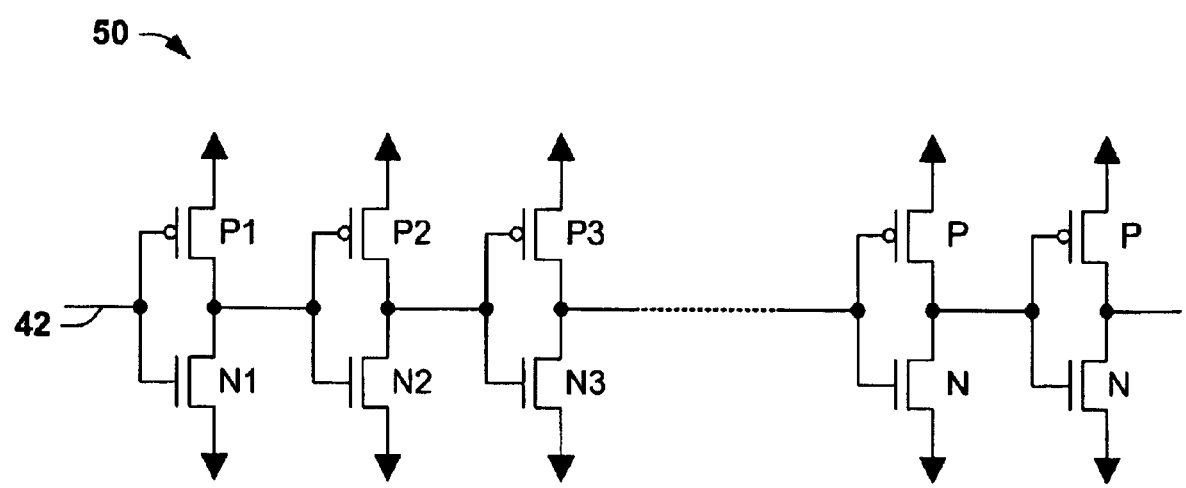
FIG. 1D is a schematic diagram illustrating an exemplary chain of floating body inverter devices.

An inverter circuit 4 in FIG. 1C includes the NMOS transistor 2, as well as a floating body PMOS transistor 40, to invert the signal level at an inverter input 42 to provide an output 44. In various cases of previous switching state history, the capacitive coupling via the capacitors 34, 36, and 38, the diode coupling via the diodes 30 and 32, and the current source I have different impacts on the floating body transistor 2 in the inverter device 4. In the case of a steady state DC condition, the input 42 is held constant for a relatively long enough period of time, wherein the capacitive coupling of capacitors 34, 36, and 38 has essentially no effect. Assuming the generated current I is negligible, the body potential of region 20 is determined by the DC solution of the body-to-drain and body-to-source diodes 32 and 34, respectively. For instance, it is assumed that a high logic level (HI) is 1.5V and a low (LO) level is 0V. If the input 42 is HI, the gate G of the NMOS transistor 2 is HI and the drain D and the source S are LO. In this situation, the body 20 is LO, wherein 0V is the DC solution of the two back-to-back connected diodes 30 and 32.

However, where the input 42 is LO, the drain D is HI and the gate G and the source S are LO. Ignoring the generated current I, the body 20 is charged by the reverse-biased body-to-drain junction leakage through the diode 32 and discharged by the weakly forward-biased body-to-source junction current through the diode 30. The body potential at 20 thus stabilizes at a value between LO and HI, depending on device properties, supply voltage and temperature, for example, about 0.25V. Due to the dependence of the threshold voltage of the transistor 2 on the bias at the body 20, the threshold voltage is lower for the same device with the gate G at LO (e.g., wherein higher body bias causes lower threshold voltage) than that at HI (e.g., lower body bias, higher threshold voltage). The converse is true for the PMOS transistor 40.

If a number of the devices 4 of FIG. 1C are cascaded to form an open chain 50 of floating body inverter devices, wherein the NMOS transistors N thereof are similar to the transistor 2 illustrated in FIGS. 1A–1C, and if the input 42 stays LO for a relatively long period of time, the transistors N1, P2, N3, etc. in the chain 50 have lower threshold voltages due to their bias condition, as compared to the devices, P1, N2, P3, etc. For example, the NMOS transistor N1 has the drain at HI and the gate and source at LO, wherein the body potential (e.g., body 20 of FIGS. 1A and 1B) is about 0.25V. Therefore, the threshold voltages of N1, N3 . . . are lower than those of N2, N4 . . . . Likewise, the threshold voltages of P2, P4 . . . are lower than those of P1, P3 . . . .

Where a LO to HI or a HI to LO switch occurs at the input 42, starting from the DC state, for instance, if the input 42 stays LO for a relatively long period of time, and then goes through a LO/HI transition. In a dynamic switching, capacitive coupling (e.g., capacitors 34, 36, and 38 of FIG. 1B) also has an effect. During the LO/HI transition, the body 20 is capacitively coupled up by the gate G through the capacitor 34 (FIG. 1B) and the forward-biased body-to-source junction diode 30 discharges the body 20. As the gate voltage ramps up beyond the threshold voltage, the body 20 is not coupled up any further because of an inversion layer formed under the gate G. At the same time, the drain voltage drops, thereby coupling down the body potential at 20. If no further switching takes place, the body 20 will eventually return to the DC equilibrium, although this may take as long as several milliseconds because generation through the two reverse-biased diodes 30 and 32 is slow. Similarly, during the HI/LO transition, the gate voltage G initially has no effect on the body potential 20 due to the inversion layer shielding the body 20. The drain voltage at D increases as the gate voltage G decreases, thereby coupling up the body potential at 20. As the gate voltage G ramps down below the threshold voltage, the body 20 is coupled down, which takes a certain amount of time if no further pulses are provided to switch the input.

For a LO/HI/LO or HI/LO/HI pulse starting from an initial DC state, for instance, if the input 42 stays LO for a relatively long period of time and rises from the LO state, the rising edge arrives at the nth stage of the chain 50 with a delay equal to $t_{pd1}+t_{pu2}+t_{pd3}+ \ldots +T_{pun}=n^*(t_{pd1}+t_{pu2})/2$ where $t_{pd1}$, the pull-down delay of the first stage, is directly related to the body potential of the nth stage NMOS transistor prior to the first switch, and the pull-up delay $t_{pu2}$ is related to the body voltage of the second stage PMOS transistor P2 prior to the first switch. The body potential of the transistors N1 and of P2 will eventually return LO. However, if before full recovery, the input falls to the LO state, the falling-edge delay through the first n stages is equal to $t_{pu1}+t_{pd2}+t_{pu3}+\ldots+t_{pdn}=n^*(t_{pu1}+t_{pd2})/2$ where $t_{pu1}$ is the delay of the first stage, which is directly related to the body potential of P1 prior to the second switch and the second stage delay $t_{pd2}$ is related to the body voltage of the NMOS transistor N2 prior to the second switch.

The body potential of the transistor N2 is coupled up from 0V to about 0.4V after the first switch. If the input pulse width ($t_{f2}$-$t_{r2}$) is much less than the time required for the body 20 to return to the DC high value, then, prior to the second switch, the body voltage of N2 is between about 0.4V and about 0.25V. Thus, $t_{pd1}>t_{pd2}$ and, for the same reason, $t_{pu1}<t_{pu2}$. In addition, $t_{pd1}+t_{pu2}>t_{pu1}+t_{pd2}$ (e.g., the falling-edge propagation is faster than the rising edge propagation), and as a result, the input pulse width becomes compressed. Conversely, the input pulse width can stretch rather than compress if $t_{pd1}+t_{pu2}<t_{pu1}+t_{pd2}$. Thus, the delay variation is determined by the relative magnitude of the four fundamental delays $t_{pd1}$, $t_{pu2}$, $t_{pu1}$ and $t_{pd2}$, which are related to the transient body voltage. The stretch is possible by decreasing coupling-down between the body 20 and the drain D (FIGS. 1A and 1B) and increasing the coupling-up between the body 20 and the gate G. In this regard, some relevant adjustment parameters include the ratio of the body-to-gate capacitance 34 to the body-to-source capacitance 36, the design threshold voltages, the properties of the body-junction diodes 30 and 32, the generation and/or recombination rate of the body 20, the Wp/Wn ratio between PMOS and NMOS transistors 40 and 2, the pulse input switching frequency, duty cycle, slew rate (e.g., rise/fall time), the power supply voltage, and the temperature, etc. Similar relationships are found for a HI/LO/HI input pulse case.

In the case of periodic pulses, after a first switch of a LO/HI/LO pulse, the body potential of the transistor NI in the chain 50 (FIG. 1D) is coupled down from the DC-HI level 0.25V to an AC dynamic level of about −0.15V. The second input switch couples up the body 20 to a level that is slightly lower than 0.4V, e.g., the AC dynamic level coupled up from the DC-LO level of 0V, but still slightly higher than the DC-HI level of about 0.3V. If another pulse follows, the first switch of the second pulse couples down the body 20 to a level that is slightly higher than −0.15V, e.g., the AC dynamic level coupled down from the DC-HI level 0.25V, but still lower than the DC-LO level of 0V. The second switch of the second pulse couples up the body 20 to a level that is slightly lower than the AC dynamic coupled-up level at the second switch of the first pulse, but still higher than the DC-HI level of 0.25V. If the circuit switches constantly, the body potential at 20 will reach a steady state value, whereat $t_{pd1}=t_{pd2}$ and $t_{pu1}=t_{pd2}$, regardless of the initial DC-HI or DC-LO state. Thus, at AC steady state, there is substantially no delay variation.

Figure 2:
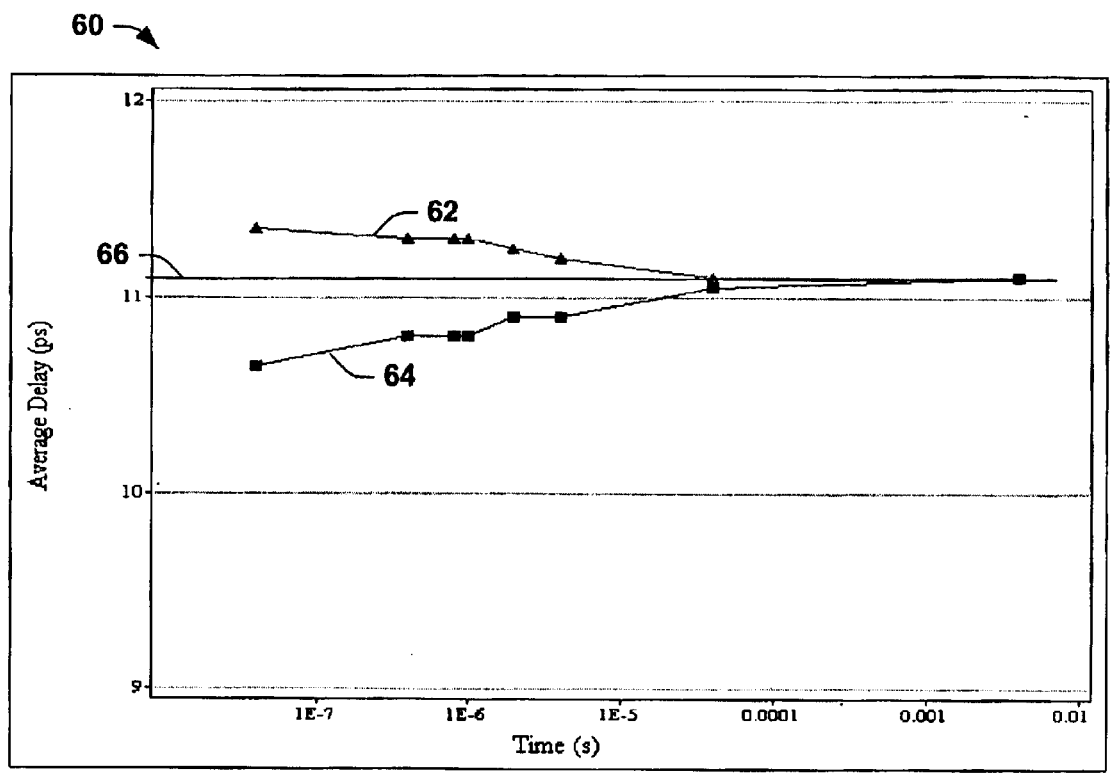
FIG. 2 is a graph illustrating exemplary floating body propagation delay vs. time in SOI floating body transistor devices for pulse edges measured from rising edge to rising edge and from falling edge to falling edge.

Referring also to FIG. 2, these floating body effects are illustrated in a graph 60 having curves 62 and 64 of propagation delay vs. time for pulse edges measured from rising edge to rising edge and from falling edge to falling edge, respectively, starting from the DC HI state. In the above example, the propagation delay times are dependent upon the floating body potential, wherein $t_{pd1}>t_{pd2}$ and $t_{pu1}<t_{pu2}$ in the floating body chain 50. Thus, where an individual inverter device in the chain 50 is initially pulsed after being at a DC steady state for a relatively long period of time (e.g., t is small in the graph 60), the falling edge to falling edge curve 62 is higher than the rising edge to rising edge curve 64. As pulses continue to be applied to the chain, the floating body potential moves less and less (e.g., f increasing in the graph 60), with the curves 62 and 64 coming closer together. Continuing on, an AC steady state condition is reached, wherein the curves 62 and 64 join at an AC steady state delay value 66, whereat $t_{pd1}=t_{pd2}$ and $t_{pu1}=t_{pu2}$, and accordingly, the propagation delay is essentially constant.

Thus, the delay caused by the body potential variation depends on the switching history. However, most circuits do not switch constantly, nor do they typically sit idle for long periods of time. Thus, manufacturing process control of this history effect is important to the design and manufacturing of floating body SOI devices. Absent some measure of control over these variations, the design margin required to protect against this uncertainty may erode some or all of the benefits provided by the SOI technology under nominal operation. Accordingly, it is desired to measure the floating body propagation delay of a particular wafer, in order to provide assurance of design veracity, as well as of manufacturing process stability.

Figure 3:
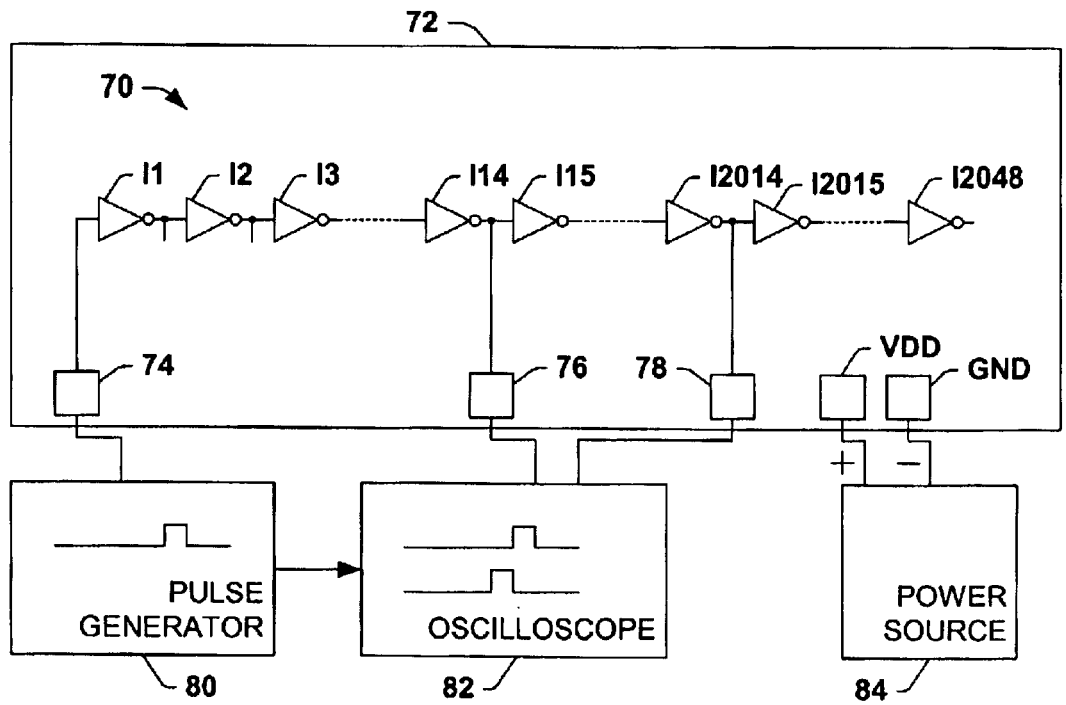
FIG. 3 is a schematic diagram illustrating a conventional test system for measuring SOI floating body delay effects using an external high speed pulse generator and oscilloscope.

Referring to FIG. 3, these effects have previously been measured using a chain 70 of floating body inverter devices I1, I2, I3, ..., I2048 formed in an SOI wafer 72, with probe pads 74, 76, and 78 for connecting a pulse generator 80 and an oscilloscope 82, respectively, to the wafer 72. Additional VDD and GND pads are provided for connection of an external power source 84 to power the devices I1–I128 and to the buffers, wherein the pulse generator 80, the oscilloscope 82, and the power source 84 constitute a test system 78. The test system 78 is operated manually on a test bench (not shown), to monitor floating body transistor switching delays under various conditions. The pulse generator 80 is connected to the input pad 72 at the input of the first inverter device I1 and to the oscilloscope 82, and one or more inverter device outputs are monitored, such as the outputs of inverters I14 and I2014 in the illustrated example, by connection of high frequency oscilloscope probes to the pads 74 and 76, respectively. However, this form of testing is time consuming, requiring an operator to manually locate trace edges of interest using the oscilloscope, and is not suited to automation. Moreover, the system 78 and the prior floating body effect measurement techniques require the use of high-resolution equipment and high speed probe cards, wherein the test structure requires a relatively long chain and the testing throughput is relatively low. In addition, accurate edge placement control in a standard wafer tester is extremely difficult for the setup of FIG. 3.

Figure 4A:
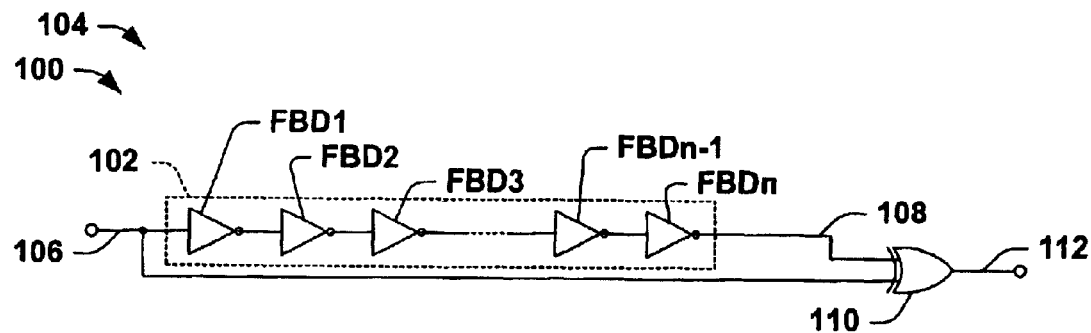
FIG. 4A is a schematic diagram illustrating an exemplary test apparatus for determining floating body delay effects in an SOI wafer in accordance with one or more aspects of the present invention.
Figure 4B:
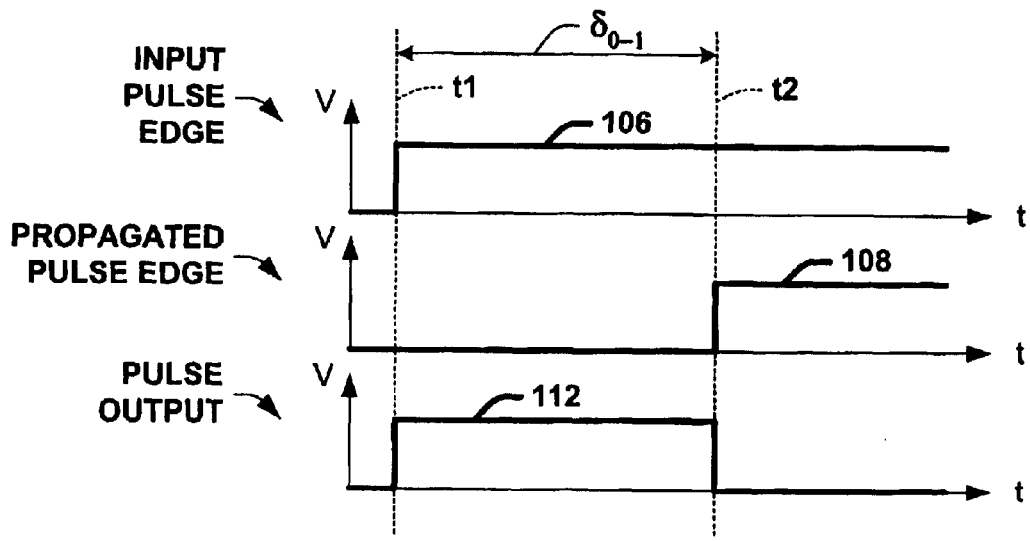
FIG. 4B is a graph illustrating exemplary signal waveforms in the apparatus of FIG. 4A during measurement of a rising-edge pulse propagation delay in accordance with the invention.
Figure 4C:
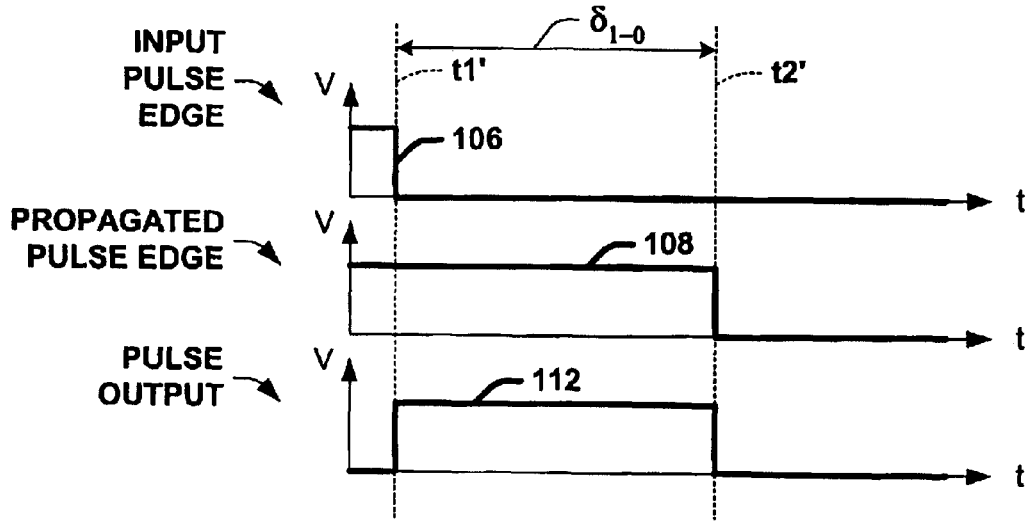
FIG. 4C is a graph illustrating exemplary signal waveforms in the apparatus of FIG. 4A during measurement of a falling-edge pulse propagation delay in accordance with the invention.

Referring now to FIGS. 4A–4C, one exemplary implementation of the present invention is illustrated comprising a test apparatus 100 for determining floating body delay effects in an SOI wafer 104. The apparatus 100 comprises a floating body chain 102 comprising a plurality of floating body inverter devices FBD1-FBDn fabricated in series with one another in a wafer 104. Any number of such devices may be employed in forming a floating body chain in accordance with the present invention, and the individual devices may be inverters or other types of devices, for example, NAND gates or others. In operation, an input pulse edge is provided at an input terminal 106 of the first inverter FBD1, such as a 0-1 (e.g., rising edge) transition or a 1-0 (e.g., falling edge) transition. The input pulse edge propagates through the devices FBD1-FBDn, eventually reaching an output 108 of the last inverter FBDn in the form of a propagated pulse edge, wherein the time it takes for the input pulse edge to travel or propagate to the output 108 varies according to the floating body effects of the devices FBD1-FBDn, including hysteretic effects.

The propagated pulse edge at the output 108, and the input pulse edge at the input 106 are provided as inputs to an exclusive-OR (XOR) gate 110, which is also fabricated in the wafer 104. The XOR gate 110 operates as a pulse generation circuit fabricated in the wafer 104, wherein any appropriate pulse generation circuit may be employed in accordance with the invention, which receives the input pulse edge and the propagated pulse edge, and provides a pulse output corresponding to a delay time associated with the floating body chain 102. In the exemplary device 100, the pulse output at an output 112 of the XOR pulse generation circuit 110 is a pulse signal having a width proportional to the propagation delay of the floating body chain 102.

FIG. 4B provides a graph illustrating exemplary signal waveforms for the input pulse edge at the chain input 106, the propagated pulse edge at the chain output 108, and a pulse output at the output 112 of the XOR pulse generation circuit 110 during measurement of a rising-edge pulse propagation delay value $\delta_{0-1}$ in accordance with the present invention. In this example, a rising input pulse edge (e.g., "0" to "1" voltage transition) is provided at the input 106 at time t1, which propagates through the floating body inverters FBD1-FBDn. The pulse output from the XOR circuit 110 at 112 goes high at time t1, and remains high while the input pulse edge propagates through the floating body chain 102 from the input 106 to the output at 108. At time t2, the propagated pulse edge reaches the output 108 of the chain 102, and the pulse output at 112 accordingly goes low. The time $\delta_{0-1}$ during which the pulse output at 112 is high is thus representative of the propagation delay through the floating body chain 102, wherein this value $\delta_{0-1}$ may be scaled by the number of devices FBD in the chain 102 to ascertain a delay value for an individual floating body device in the wafer 104 with respect to rising input pulse edge propagation.

FIG. 4C provides a graph illustrating exemplary signal waveforms for the input pulse edge at the chain input 106, the propagated pulse edge at the chain output 108, and a pulse output at the output 112 of the XOR pulse generation circuit 110 during measurement of a falling-edge pulse delay $\delta_{0-1}$. A falling input pulse edge (e.g., a voltage transition from "1" to "0") is provided at the input 106 at time t1', which propagates through the floating body inverters FBD1-FBDn, where the pulse output at 112 goes high at time t1', and remains high while the input pulse edge propagates through the floating body chain 102. Thereafter at a time t2', the propagated pulse edge reaches the output 108 of the chain 102 and the pulse output at 112 goes low. Thus, the time $\delta_{0-1}$ during which the pulse output at 112 is high represents the propagation delay through the floating body chain 102 for a falling edge.

It is noted from the above discussion of floating body effects that the floating body delay through the chain 102 may vary according to various test conditions, including the supply voltage for the test apparatus 100, the amount of preconditioning of the chain 102, and/or the direction or polarity of the pulse edge applied to the chain input 106. Thus, the measured delay values for $\delta_{0-1}$ and $\delta_{0-1}$ may be different from one another, and may vary according to the amount of preconditioning in the floating body chain 102.

The pulse output 112 from the XOR pulse generation circuit 110 may be probed during testing, whereupon a determination of the delay values $\delta$ may be made using appropriate test systems, for example, using test circuitry, oscilloscopes, processor based testers, or the like, which are adapted to measure the width of the output pulse signal at 112.

Another exemplary test apparatus 200 is illustrated in FIGS. 5A–5F, wherein the apparatus 200 is provided in an SOI wafer 204 as part of a test system 304 for determining or characterizing floating body effects in the wafer 204. Like the circuitry of FIG. 4A above, the test apparatus 200 in FIGS. 5A and 5C includes a floating body chain 202 comprising a plurality of floating body inverter devices FBD1-FBDn fabricated in series with one another in the wafer 204, wherein any number and/or type of floating body devices may be employed in accordance with the invention. The floating body chain 202 has an input 206 to which an input pulse edge is provided to the first device FBD1, and an output 208 which provides a propagated pulse edge. The input pulse edge propagates from the input 206 and through the floating body devices FBD1-FBDn, and eventually reaches the output 208 of the last inverter FBDn in the form of a propagated pulse edge, where the propagation time through the floating body chain 202 may vary according to the floating body effects of the devices FBD1-FBDn, such as the hysteretic effects discussed above.

The apparatus 200 further comprises an (XOR) gate pulse generation circuit 210 fabricated in the wafer 204, which receives the propagated pulse edge at the output 208, and the input pulse edge at the input 206 as inputs. Any appropriate pulse generation circuit may be employed in accordance with the invention, including but not limited to the XOR gate 210, which receives the input pulse edge and the propagated pulse edge, and provides a pulse output at the circuit output 212 corresponding to a delay time associated with the floating body chain 202. In the device 200, for example, the pulse output at 212 is a pulse signal having a width proportional to the propagation delay of the floating body chain 202.

Figure 5A:
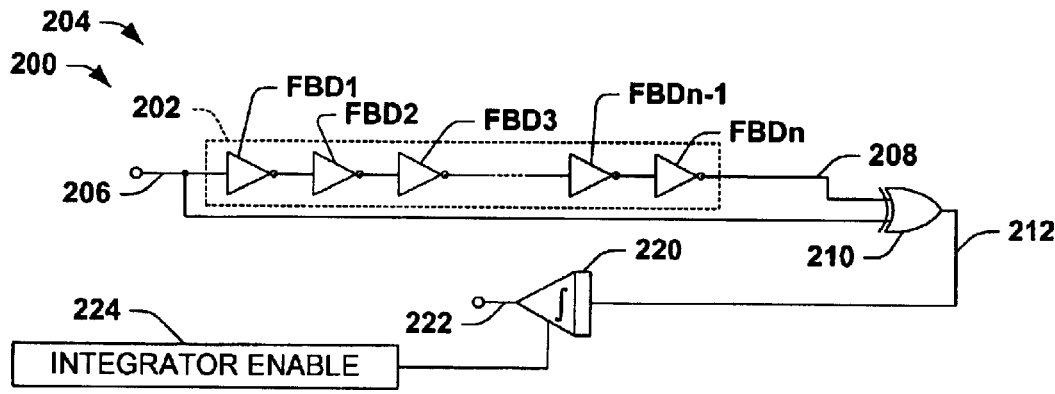
FIG. 5A is a schematic diagram illustrating another exemplary test apparatus for characterizing floating body delay effects in an SOI wafer in accordance with another aspect of the present invention.
Figure 5B:
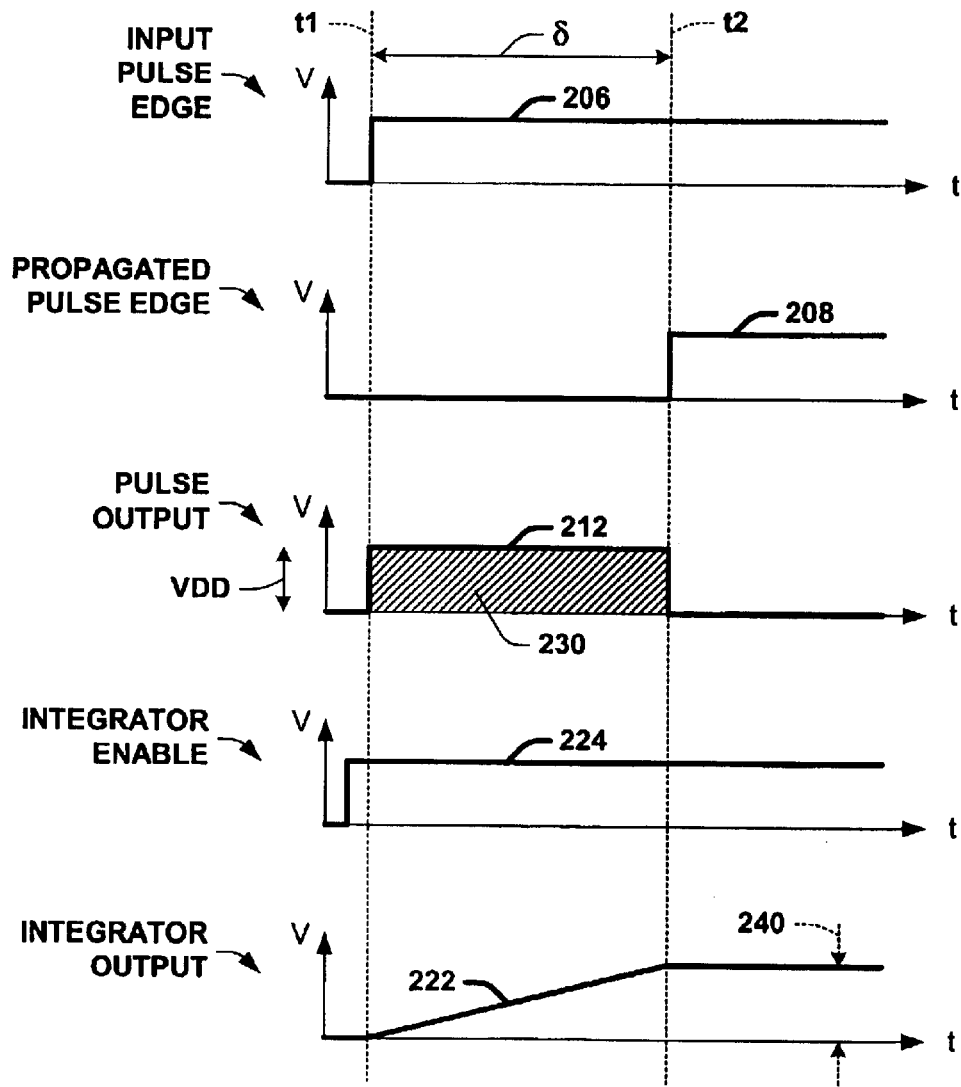
FIG. 5B is a graph illustrating exemplary signal waveforms in the apparatus of FIG. 5A during measurement of a rising-edge pulse propagation delay in accordance with the invention.

In FIG. 5B, a graph is provided to illustrate exemplary signal waveforms for the input pulse edge at the chain input 206, the propagated pulse edge at the chain output 208, and a pulse output at the output 212 of the XOR pulse generation circuit 210 for measurement of a rising-edge pulse delay $\delta_{0-1}$ in accordance with the invention. A rising input pulse edge is provided at the input 206 at time t1, causing the pulse output at 212 to go high. The input pulse edge propagates through the floating body 202, while the pulse output remains high, until a time t2, when the propagated pulse edge reaches the output 208 and the pulse output at 212 again goes low. The time 8 during which the pulse output at 212 is high is thus representative of the propagation delay through the floating body chain 202.

In addition to the floating body chain 202 and the pulse generation XOR circuit 210, the exemplary test apparatus 200 comprises an integrator 220, which receives the pulse output from the output 212 of the XOR pulse generator 210. The integrator 220 operates to integrate the pulse output from the pulse generator 210 and to provide an integrator output 222 corresponding to an integral of the pulse output at 212. In this implementation, the integrator output 222 is a voltage signal having an amplitude corresponding to the delay time associated with the floating body chain 202. The exemplary integrator 220 further comprises an enable input 224, wherein the integrator 220 selectively integrates the pulse output and provides the integrator output 222 when the enable input 224 is a first state (e.g., high or "1" in this example), and refrains from integrating and providing the integrator output 222 when the enable input 224 is in a second state (e.g., low or "0"). As illustrated and described further hereinafter, the integrator enable 224 facilitates use of the apparatus 200 in determining floating body effects in the presence of one or more preconditioning pulses in the floating body chain 202.

As illustrated in FIG. 5B, the pulse output signal at the output 212 of the XOR device 210 has a generally constant amplitude VDD. Accordingly, the propagation delay of the floating body chain 202 (e.g., the width of the pulse output at 212) corresponds to an area 230 under the output curve 212. As a result, where the integrator 220 is enabled (e.g., via the integrator enable control 224) while the pulse output is high at 212, the integrator output 222 is a voltage signal having an amplitude 240 representative of the floating body chain delay. For example, in the exemplary test apparatus 200, the amplitude 240 of the integrator output at 222 is proportional to the product of the pulse output width δ and the supply voltage VDD, whereupon a simple reading of the integrator output 222 (e.g., using a volt meter or other instrument) provides an analog indication of the floating body effects (e.g., floating body device chain propagation delay) in the SOI wafer 204.

Figure 5C:
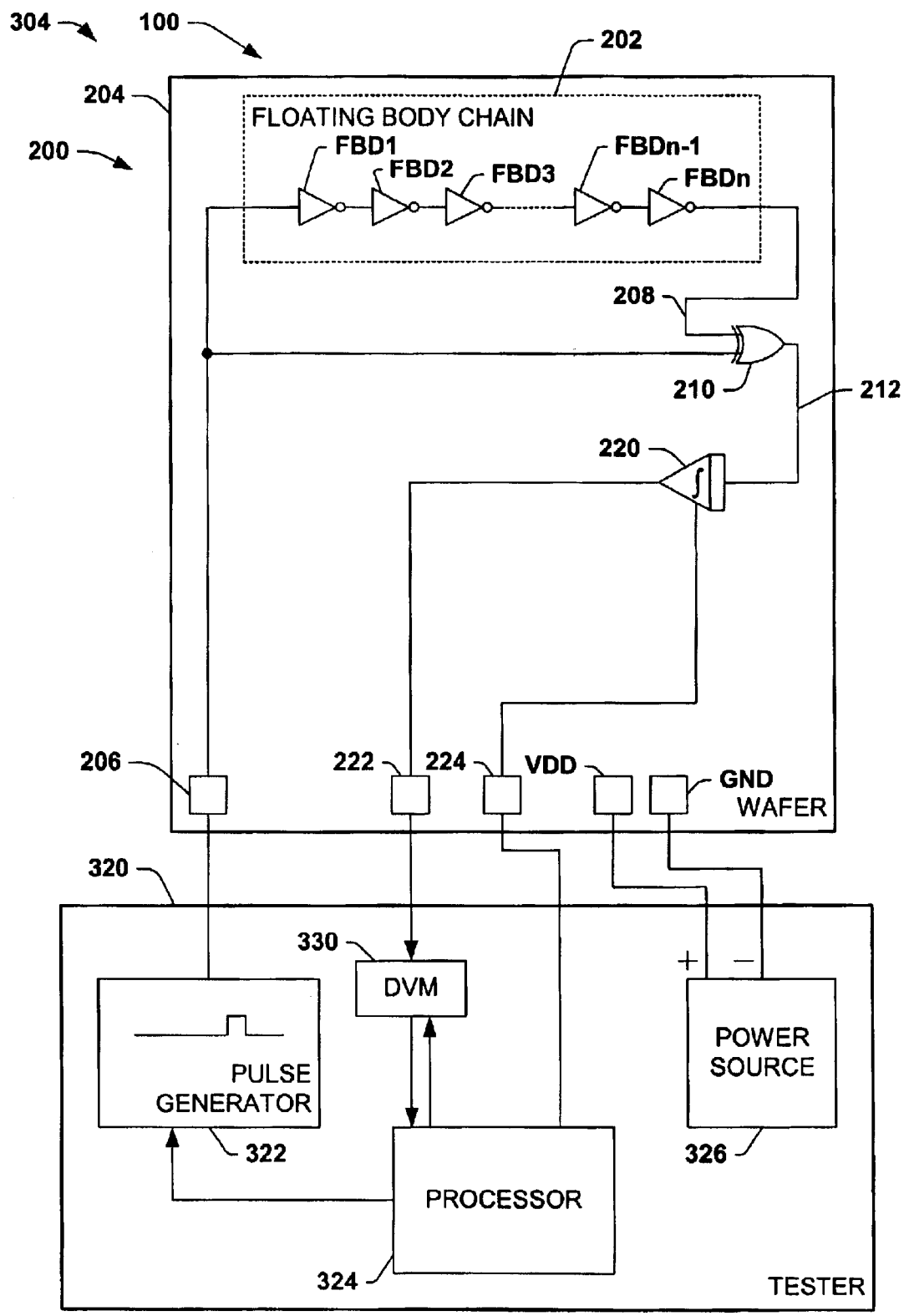
FIG. 5C is a schematic diagram illustrating an exemplary test system employing the test apparatus of FIG. 5A for characterizing floating body delay effects in an SOI wafer in accordance with the invention.
Figure 5D:
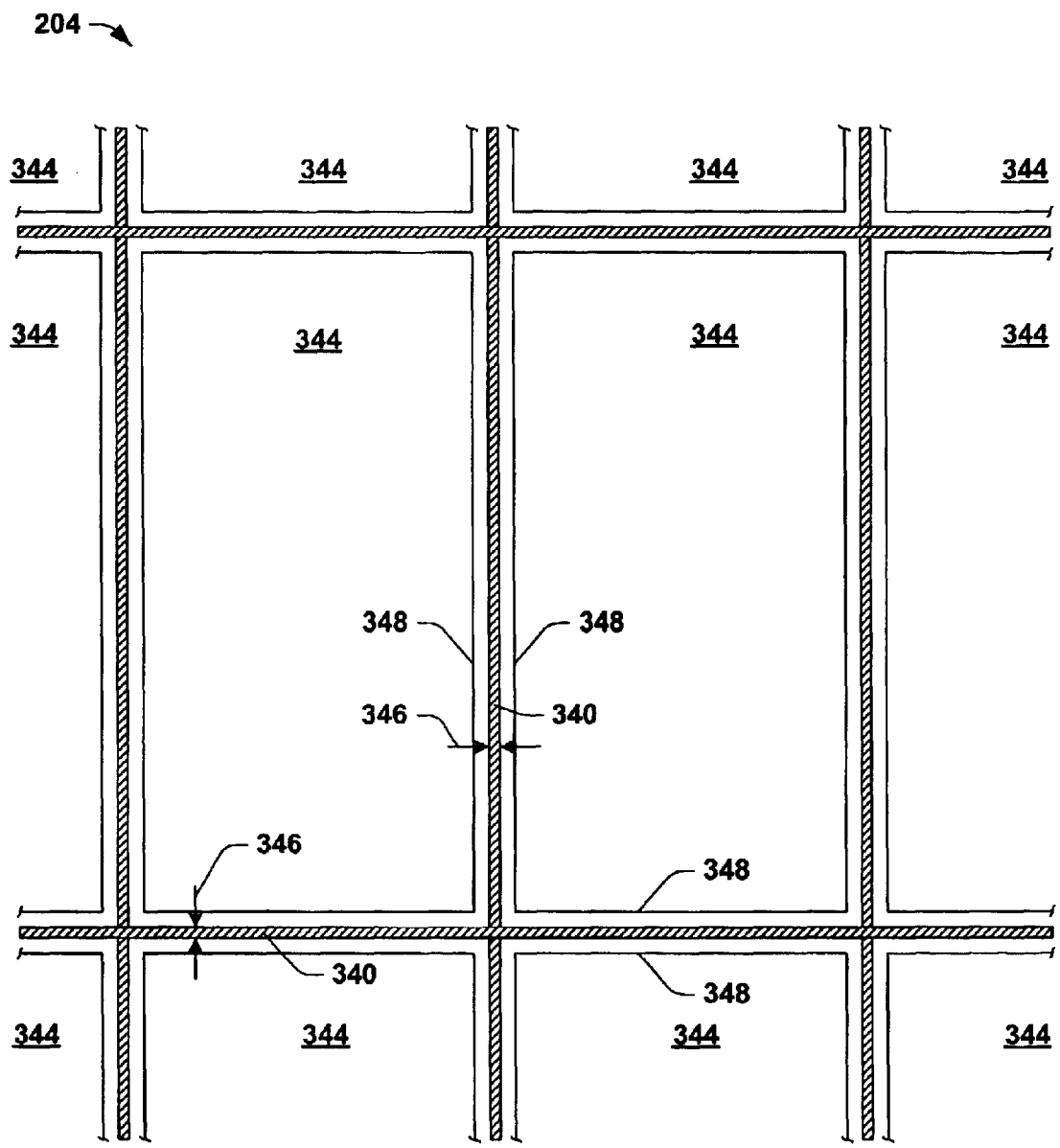
FIG. 5D is a partial top plan view illustrating a portion of a wafer having scribe line regions between adjacent die areas, in which the test apparatus FIGS. 4A and/or 5A may be formed.

Referring now to FIGS. 5C and 5D, the present invention provides test systems and apparatus for measuring hysteretic propagation delays and/or other floating body effects in SOI wafers, in which measurements may be automated using commercially available test equipment. In this regard, the present invention may be implemented to facilitate testing of a delay chain or other test circuitry, and may be carried out using commercially available testers and probe cards therefore. Moreover, the test systems and apparatus illustrated and described herein, and other apparatus may be employed in practicing one or more methods of the present invention, as described further below with respect to FIGS. 6 and 7.

As illustrated in FIGS. 5C and 5D, a test system 304 is illustrated, comprising the exemplary test apparatus 200 of FIG. 5A, formed in the wafer 204, as well as a tester 320. A pulse input pad couples the input 206 of the first floating body device FBD1 to receive a pulse edge or pulse train from a pulse generator 322 in the tester 320. The tester may be an IO card in a PC or other commercially available tester, having a processor 324 and associated memory (not shown) for storage of program instructions, data, and the like. Alternatively, the tester may be a bench test setup or any appropriate combination of components, circuits, instruments, or the like, by which electrical power and pulse edges or pulse trains may be applied to the wafer pads, and measurements of pulse output widths and/or integrator output signals may be obtained.

In the exemplary test system 304, the integrator output 222 is coupled with a measurement device or sensor (e.g., a digital volt meter (DVM)) 330 in the tester 320, wherein the processor 324 communicates with the DVM 330 to obtain data values therefrom and to initiate readings of the integrator output 222. In addition, the processor 324 controls operation of the pulse generator 322 so as to provide a pulse edge or pulse train of interest to the floating body chain input 206 and to the pulse generation XOR circuit 210. The processor 324 is further operable to selectively provide an integrator enable signal 224 to the integrator 220, to determine floating body delay values according to the readings from the DVM 330, and to generate corresponding data points for characterizing floating body effects in the SOI wafer 204, for example, such as the delay curves 62, 64 illustrated in FIG. 3 above. The exemplary tester 320 further provides electrical power (e.g., VDD and ground GND) to the various devices in the test apparatus 200 in the wafer 204 using a power source 326 coupled with VDD and GND pads on the wafer 204.

As illustrated in FIG. 5D, the exemplary test apparatus 200 is implemented as a scribe line monitor (SLM) formed in scribe line regions 340 of the wafer 204 between adjacent die areas 344 thereof, although the test apparatus 200 and other apparatus in accordance with the present invention may be alternatively fabricated anywhere on the wafer 204. The exemplary die areas 344 are generally rectangular regions within die boundaries 348, in which individual electrical components and circuits (not shown) are formed in fabricating integrated circuit devices. The scribe line regions 340 are defined between adjacent die areas 344, through which channels are subsequently saw-cut to separate the individual dies 344 from the wafer 204. The scribe line regions 340 commonly have a width 346 sufficient to accommodate the width of saw blades or other separation tools (not shown) and to provide appropriate tool alignment tolerance during subsequent die separation operations.

The test apparatus 200 of the present invention may alternatively be formed in the die areas 344. However, it is noted that locating the test apparatus 200 in the scribe line regions 340 facilitates improved device density and space utilization in the die areas 344, wherein the test apparatus 200 may be employed to characterize the SOI manufacturing process prior to die separation. The test apparatus of the invention thus facilitates automated wafer level testing, and also provides the opportunity for fast characterization of floating body effects using relatively simple bench test equipment for providing power and pulse edges to the apparatus 200, and for measuring the pulse width of the pulse output 212 and/or the amplitude of the integrator output 222. In this regard, alternate implementations of the test system 304 and/or the test apparatus 100, 200 may be employed, wherein the pulse output 112, 212 is coupled with a probe pad for access by a tester, wherein the tester is configured to ascertain the pulse width thereof, and to determine the floating body chain propagation delay accordingly. In addition, it will be appreciated that testers and test systems may be provided with external equipment and circuitry apart from the specific examples illustrated and described herein, and that all such alternate implementations are contemplated as falling within the scope of the present invention.

Figure 5E:
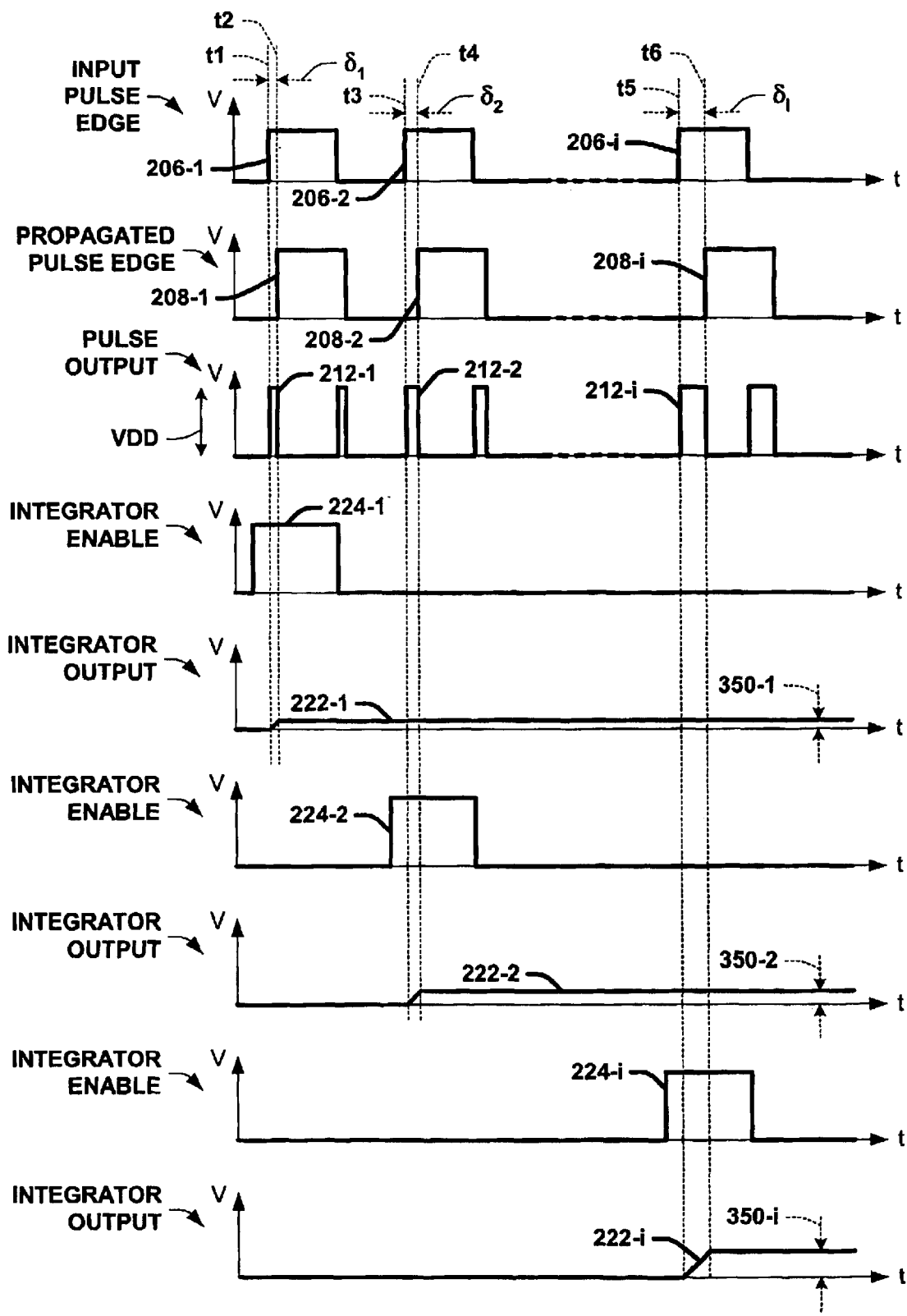
FIG. 5E is a graph illustrating exemplary signal waveforms in the apparatus of FIGS. 5A and 5C during measurement of a rising-edge pulse propagation delay with preconditioning.

Referring now to FIG. 5E, the exemplary test apparatus 200 of FIGS. 5A–5C may be employed in determining various delay values for use in characterizing floating body effects in the SOI wafer 204. For example, in plotting curves such as 62 and 64 of FIG. 2 above, several data points or delay values are measured for different amounts of preconditioning. To plot a curve for rising edge delay performance, a series of tests may be performed using the exemplary test system 304 of FIG. 5C. To obtain a first data point, a first pulse edge 206-1 (FIG. 5E) is provided to the floating body chain input 206 at time t1 (e.g., a rising edge in this example), resulting in a rising propagated pulse edge 208-1 at time t2, and a corresponding pulse output 212-1 having a width t2-t1=$\delta_1$ corresponding to the propagation delay of the floating body chain 202 for no preconditioning. The integrator enable signal 224-1 is provided to allow integration of the pulse output 212-1, resulting in the integrator output 222-1 having an amplitude 350-1 representative of the floating body delay for the case of no preconditioning. This value may be plotted, for example, as a first data point on the curve 62 of FIG. 2 for rising-edge delays. It will be appreciated that the actual delay value may be obtained from the amplitude value 350-1, for example, by scaling the amplitude 350-1 by the voltage VDD, and by the number n of floating body devices FBD in the chain 202.

To obtain a delay value for a single preconditioning pulse, a first rising pulse edge 206-1 is provided to the input 206 at time t1, followed by a falling edge, and then a second rising pulse edge 206-2 at time t3. The integrator 220 is enabled by an enable signal pulse 224-2 prior to t3, as shown in FIG. 5E. The second rising input pulse edge 206-2 results in a rising propagated pulse edge 208-2 at time t4, and a pulse output 212-2 having a width t4-t3=$\delta_2$, which corresponds to the propagation delay of the floating body chain 202 for one preconditioning pulse. The provision of the integrator enable signal pulse 224-2 causes integration of the pulse output 212-2, resulting in the integrator output 222-2 having an amplitude 350-2 representative of the floating body delay for the case of a single preconditioning pulse, which may then be plotted in the curve 62.

This process may be repeated for any desired number of preconditioning pulses to generate the performance curve 62. Thus, an integer number i-1 such preconditioning pulses may be applied before determining the floating body propagation delay through the n floating body devices FBD1-FBDn in the chain 202 for the pulse. In this regard, to measure a delay value for i-1 preconditioning pulses, a rising pulse edge 206-i is provided to the input 206 at time t5 after i-1 preconditioning pulses, where the integrator 220 is enabled by an enable signal pulse 224-i prior to t5. The input pulse edge 206-i leads to a rising propagated pulse edge 208-i at time t6, as well as a pulse output 212-i having a width t6-t5=$\delta_i$, corresponding to the propagation delay of the floating body chain 202 for i-1 preconditioning pulses. The integrator enable signal pulse 224-i provides for integration of the pulse output 212-i, resulting in the integrator output 222-i having an amplitude 350-i, which represents the floating body delay for the case of i-1 single preconditioning pulses. Similar techniques may be employed to measure data points for falling edge pulse delays using the system 304 and the apparatus 200.

Figure 5F:
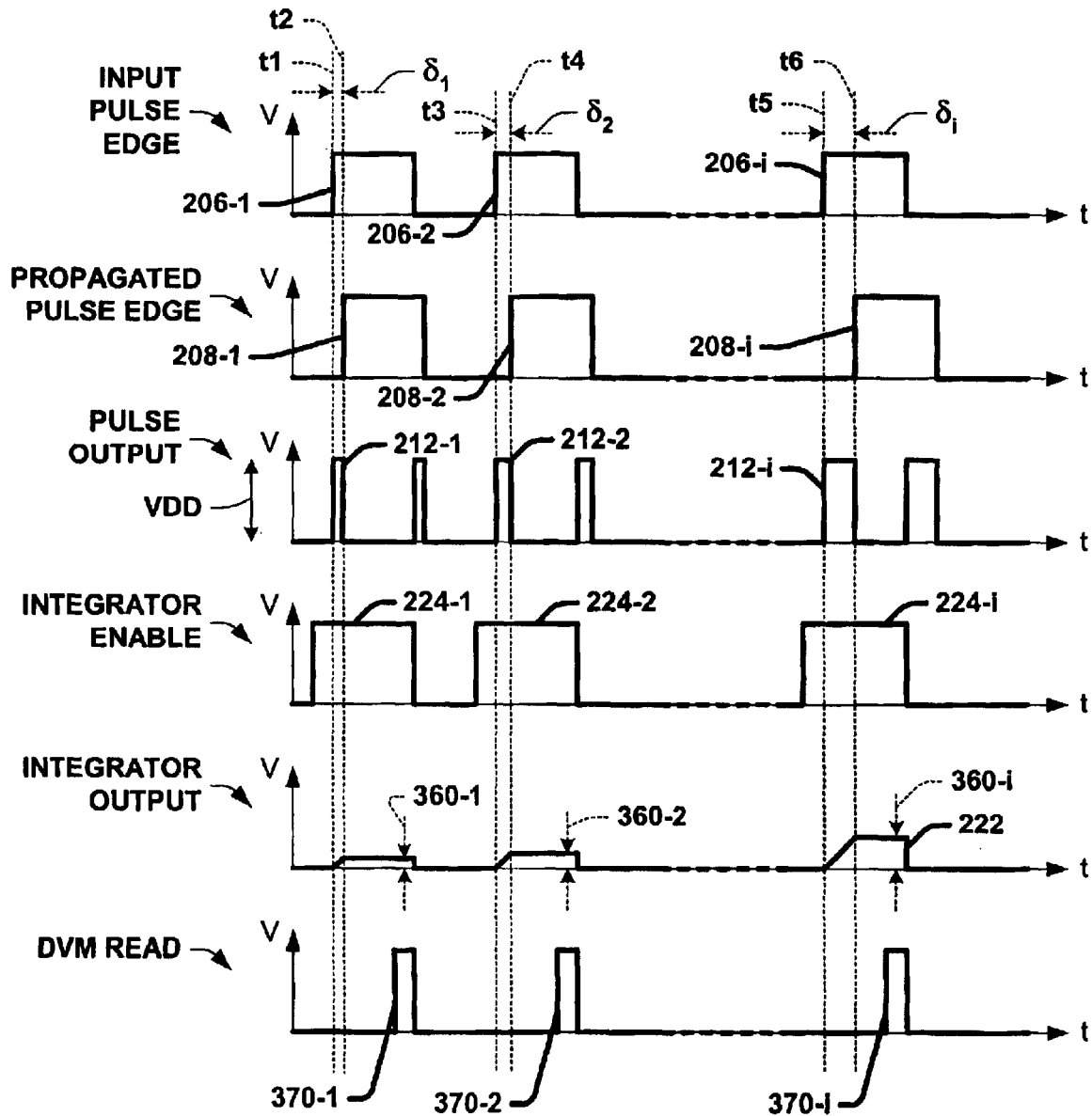
FIG. 5F is a graph illustrating exemplary signal waveforms in the apparatus of FIGS. 5A and 5C during measurement of a rising-edge pulse propagation delay with varying amounts of preconditioning in a single pass test.

Referring now to FIG. 5F, the exemplary system 304 and apparatus 200 thereof may also be operated in a single-pass test fashion to ascertain a number of data points along the curve 62 or other delay curve of interest. Again using the example of rising pulse edge delays, the processor 324 controls the pulse generator 322 to provide a pulse train (e.g., a series of pulses) to the input 206 of the floating body chain 202, which includes successive rising pulse edges 206-1, 206-2, and 206-i, at times t1, t3, and t5, respectively. These input pulse edges 206 cause a series of corresponding propagated pulse edges 208-1, 208-2, and 208-i at times t2, t4, and t6, and also pulse outputs 212-1, 212-2, and 212-i having widths $\delta_1$, $\delta_2$, and $\delta_i$, respectively.

In the single-pass test operation illustrated in FIG. 5F, moreover, the processor 324 selectively enables the integrator 220 via a series of integrator enable signal pulses 224-1, 224-2, and 224-i, to cause the integrator 220 to integrate the pulse outputs 212-1, 212-2, and 212-i, respectively, wherein the integrator outputs 222 corresponding therewith have amplitudes 360-1, 360-2, and 360-i, as illustrated in FIG. 5F. The processor 324 further provides DVM read control signals 370-1, 370-2, and 370-i to the DVM 330, to obtain readings of the integral values 360-1, 360-2, and 360-i, respectively, in a single-pass test. Thus, it will be appreciated that the system 304 and the apparatus 200 of the invention facilitate expeditious plotting of floating body delay curves, such as illustrated in FIG. 2, using simple test equipment, by which an SOI process can be evaluated in a production setting.

Figure 6:
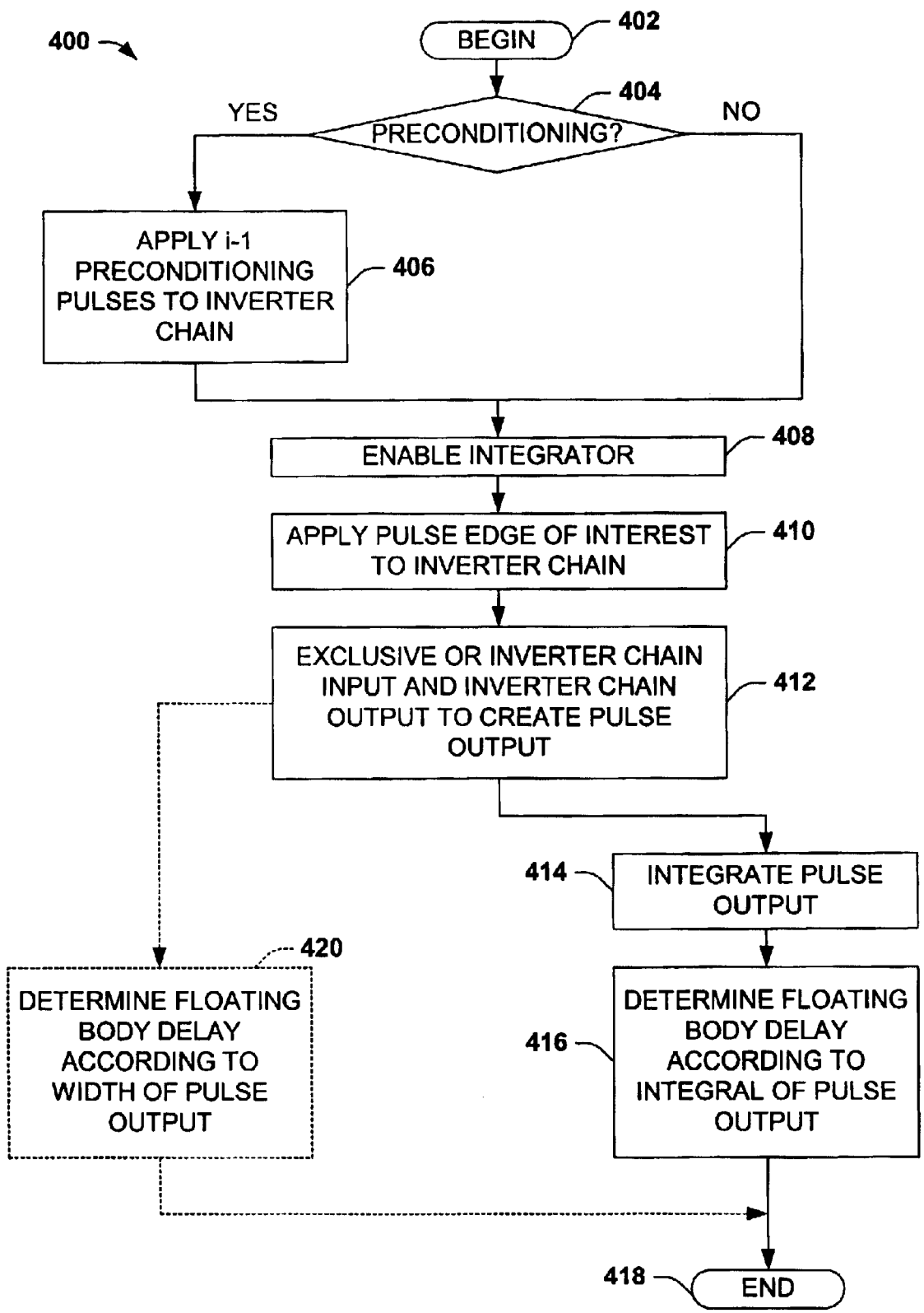
FIG. 6 is a flow diagram illustrating an exemplary method of determining or characterizing a floating body delay value in accordance with the invention.
Figure 7:
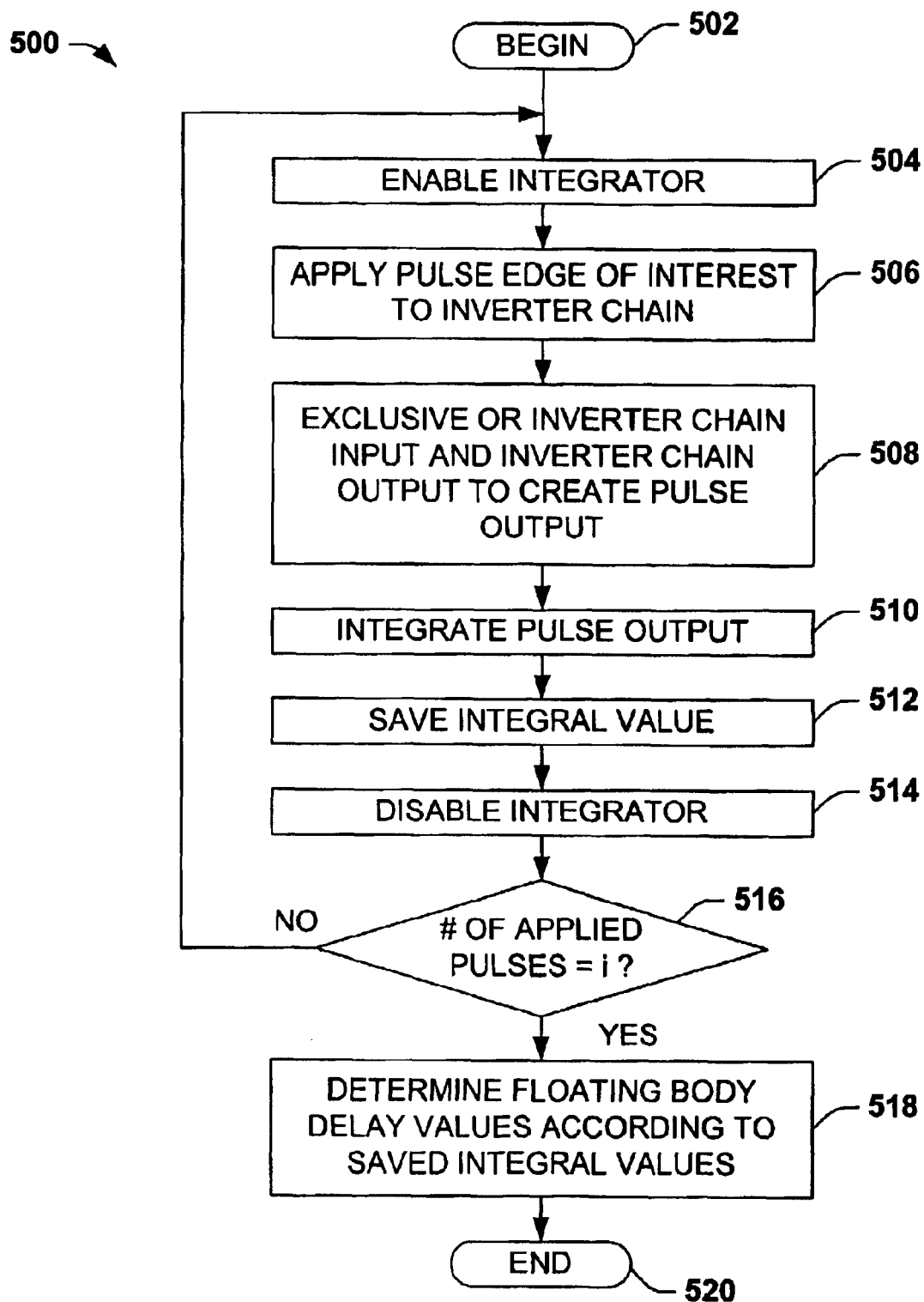
FIG. 7 is a flow diagram illustrating another exemplary method of determining a number of floating body delay values for varying amounts of preconditioning in accordance with another aspect of the invention.

Referring now to FIGS. 6 and 7, other aspects of the invention provide methods for determining floating body delay effects in an SOI wafer, wherein exemplary methods 400 and 500 are illustrated and described below with respect to FIGS. 6 and 7, respectively. Although each of the methods 400 and 500 are illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the apparatus and systems illustrated and described herein as well as in association with other apparatus or systems not illustrated.

In FIG. 6, the exemplary method 400 begins at 402, and a determination is made at 404 as to whether preconditioning pulses are to be employed in measuring a floating body delay value in an SOI wafer. If so, an integer number i-1 preconditioning pulses are applied at 406 to a floating body inverter chain (e.g., chain 202 of the exemplary apparatus 200 above), where i is an integer greater than 1. Thereafter, the integrator is enabled at 408 (e.g., by actuation of signal 224), and a pulse edge of interest is applied to the inverter chain at 410, such as applying a rising pulse edge to the input 206 in the above example. At 412, a pulse output is created (e.g., which is a function of the propagation delay through the inverter chain) by performing an exclusive OR function on the inverter chain input and the inverter chain output (e.g., on the input pulse edge and the propagated pulse edge).

The pulse output is then integrated at 414 and a floating body delay is determined at 416 according to the integral of the pulse output (e.g., and the number of devices FBD in the chain 202), before the method 400 ends at 418. As one possible alternative, the floating body delay may be determined at 410 directly according to the width of the pulse output. Thus, for example, in the exemplary test apparatus 100 of FIG. 4A, or in the apparatus 200 of FIG. 5A, the pulse outputs 112, 212 have pulse widths corresponding to the delay time associated with the respective floating body chains 102, 202, wherein any appropriate techniques can be employed at 420 to ascertain the width of the pulses 112, 212, and to determine the delay value based thereon (e.g., by scaling the pulse width by the number of floating body devices in the chains 112, 212).

Referring now to FIG. 7, another exemplary method 500 may be employed in obtaining two or more delay values or data points in a single-pass type test. Beginning at 502, the method 500 comprises enabling an integrator at 504 (e.g., the integrator 220 of the exemplary apparatus 200 in FIGS. 5A and 5C above), and applying a pulse edge of interest to a floating body inverter chain at 506. At 508, the inverter chain input and output are exclusive ORed to create a pulse output (e.g., XOR pulse output 212 above), which is then integrated at 510. The integral value for the pulse output is then saved at 512 (e.g., by the processor 324 in the tester 320 of FIG. 5C), and the integrator is disabled at 514.

A determination is then made at 516 as to whether the desired number of pulses have been applied to the floating body chain. If not (e.g., NO at 516), the method 500 returns to 504, where the integrator is again enabled. The process repeats steps 504–516 to successively apply further pulses, and obtain further integral values until the desired number i pulses have been applied (e.g., YES at 516). At 518, floating body delay values are determined according to the saved integral values, before the method 500 ends at 520.

Although the invention has been illustrated and described herein with respect to one or more implementations, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A test apparatus for determining floating body delay effects in an SOI wafer, comprising:
   a floating body chain comprising an input for receiving an input pulse edge, a plurality of floating body devices fabricated in series with one another in the wafer, and an output for providing a propagated pulse edge associated with propagation of the input pulse edge through the floating body devices; and
   a pulse generation circuit fabricated in the wafer, the pulse generation circuit receiving the input pulse edge and the propagated pulse edge, and providing a pulse output corresponding to a delay time associated with the floating body chain according to the input pulse edge and the propagated pulse edge.

2. The apparatus of claim 1, wherein the floating body devices are inverters individually comprising floating body MOS transistors fabricated in the wafer.

3. The apparatus of claim 2, wherein the floating body chain comprises a first floating body inverter having an input for receiving the input pulse edge from a pulse generator, a last floating body inverter having an output providing the propagated pulse edge, and a plurality of intermediate floating body inverters serially connected between the first and last floating body inverter, wherein a voltage transition at the input of the first floating body inverter propagates through the floating body chain to create the propagated pulse edge at the output of the last floating body inverter.

4. The apparatus of claim 3, comprising a pulse input pad formed in the wafer and being electrically coupled with the input of the first floating body inverters and with the pulse generation circuit, and a pair of power connection pads coupled with power terminals of the devices in the floating body chain and the pulse generation circuit, and operable to provide electrical power from an external power source to the devices in the wafer.

5. The apparatus of claim 3, wherein the pulse generation circuit provides the pulse output comprising a first state before the input pulse edge is provided to the input of the first floating body inverter and after the propagated pulse edge is provided at the output of the last floating body inverter, and a second state after the input pulse edge is provided to the input of the first floating body inverter and before the propagated pulse edge is provided at the output of the last floating body inverter.

6. The apparatus of claim 5, wherein the pulse generation circuit comprises an exclusive-OR device comprising:
   a first pulse generation input coupled with the input of the first floating body inverter to receive the input pulse edge;
   a second pulse generation input receiving the propagated pulse edge from the output of the last floating body inverter; and
   a pulse generation output providing the pulse output.

7. The apparatus of claim 6, wherein the pulse output is a pulse comprising a width corresponding to a delay time associated with the floating body chain.

8. The apparatus of claim 7, further comprising an integrator receiving the pulse output from the pulse generator, the integrator being adapted to integrate the pulse output from the pulse generator and to provide an integrator output corresponding to an integral of the pulse output.

9. The apparatus of claim 8, wherein the integrator comprises an enable input, and wherein the integrator is adapted to selectively integrate the pulse output and to provide the integrator output when the enable input is a first state, and to refrain from integrating and to refrain from providing the integrator output when the enable input is in a second state.

10. The apparatus of claim 8, wherein the integrator output is a voltage signal having an amplitude corresponding to the delay time associated with the floating body chain.

11. The apparatus of claim 3, further comprising an integrator receiving the pulse output from the pulse generator, the integrator being adapted to integrate the pulse output from the pulse generator and to provide an integrator output corresponding to an integral of the pulse output.

12. The apparatus of claim 11, wherein the integrator comprises an enable input, and wherein the integrator is adapted to selectively integrate the pulse output and to provide the integrator output when the enable input is a first state, and to refrain from integrating and to refrain from providing the integrator output when the enable input is in a second state.

13. The apparatus of claim 11, wherein the integrator output is a voltage signal having an amplitude corresponding to the delay time associated with the floating body chain.

14. The apparatus of claim 1, further comprising an integrator receiving the pulse output from the pulse generator, the integrator being adapted to integrate the pulse output from the pulse generator and to provide an integrator output corresponding to an integral of the pulse output.

15. The apparatus of claim 14, wherein the integrator comprises an enable input, and wherein the integrator is adapted to selectively integrate the pulse output and to provide the integrator output when the enable input is a first state, and to refrain from integrating and to refrain from providing the integrator output when the enable input is in a second state.

16. The apparatus of claim 14, wherein the integrator output is a voltage signal having an amplitude corresponding to the delay time associated with the floating body chain.

17. The apparatus of claim 14, wherein the pulse generation circuit provides the pulse output comprising a first state before the input pulse edge is provided to the input of the first floating body inverter and after the propagated pulse edge is provided at the output of the last floating body inverter, and a second state after the input pulse edge is provided to the input of the first floating body inverter and before the propagated pulse edge is provided at the output of the last floating body inverter.

18. The apparatus of claim 1, wherein the pulse generation circuit provides the pulse output comprising a first state before the input pulse edge is provided to the floating body chain and after the propagated pulse edge is provided at the output of the floating body chain, and a second state after the input pulse edge is provided to the floating body chain and before the propagated pulse edge is provided at the output of the floating body chain.

19. The apparatus of claim 18, wherein the pulse generation circuit comprises an exclusive-OR device comprising:
   a first pulse generation input coupled with the input of the floating body chain to receive the input pulse edge;
   a second pulse generation input receiving the propagated pulse edge from the output of the floating body chain; and
   a pulse generation output providing the pulse output.

20. The apparatus of claim 19, wherein the pulse output is a pulse comprising a width corresponding to a delay time associated with the floating body chain.

21. A test system for determining floating body delay effects in an SOI wafer, comprising:
   a floating body chain comprising an input for receiving an input pulse edge, a plurality of floating body devices fabricated in series with one another in the wafer, and an output for providing a propagated pulse edge associated with propagation of the input pulse edge through the floating body devices; and
   a pulse generation circuit fabricated in the wafer, the pulse generation circuit receiving the input pulse edge and the propagated pulse edge, and providing a pulse output corresponding to a delay time associated with the floating body chain according to the input pulse edge and the propagated pulse edge; and
   a tester comprising means for providing the input pulse edge to the input of the floating body chain, means for sensing the pulse output from the pulse generation circuit, and means for determining at least one floating body delay according to the pulse output.

22. The system of claim 21, further comprising an integrator fabricated in the wafer and receiving the pulse output from the pulse generator, the integrator being adapted to integrate the pulse output from the pulse generator and to provide an integrator output corresponding to an integral of the pulse output.

23. The system of claim 22, wherein the means for providing the input pulse edge comprises a pulse generator coupleable to the floating body chain, wherein the means for sensing the pulse output from the pulse generation circuit comprises a volt meter coupled with the integrator to receive the integrator output and to provide a signal representative of the integrator output, and wherein the means for determining at least one floating body delay comprises a processor receiving the signal from the volt meter, wherein the processor controls the pulse generator to selectively provide one or more pulse edges to the floating body chain and determines at least one floating body delay according to the signal from the volt meter.

24. The system of claim 23, wherein the integrator comprises an enable input controlled by the processor, and wherein the integrator is adapted to selectively integrate the pulse output and to provide the integrator output when the enable input is a first state, and to refrain from integrating and to refrain from providing the integrator output when the enable input is in a second state.

25. A test method for determining floating body delay effects in an SOI wafer, the method comprising:
   providing a first pulse edge to a floating body chain comprising a plurality of series connected floating body devices in the SOI wafer;
   providing a first pulse output corresponding to a delay time associated with the floating body chain according to the first input pulse edge and a first propagated pulse edge; and
   determining a first floating body delay value according to the first pulse output.

26. The method of claim 25, wherein determining the first floating body delay value comprises:
   integrating the first pulse output to provide a first integral value; and
   determining the first floating body delay value according to the first integral value.

27. The method of claim 26, further comprising providing at least one preconditioning pulse to the floating body chain before providing the first pulse edge, providing the first pulse output, and determining the first floating body delay value.

28. The method of claim 25, further comprising providing at least one preconditioning pulse to the floating body chain before providing the first pulse edge, providing the first pulse output, and determining the first floating body delay value.

29. The method of claim 25, further comprising:
   providing a second pulse edge to a floating body chain after providing the first pulse output;
   providing a second pulse output corresponding to a second delay time associated with the floating body chain according to the second input pulse edge and a second propagated pulse edge; and
   determining a second floating body delay value according to the second pulse output.

* * * * *